(12) United States Patent
Moench et al.

(10) Patent No.: US 8,023,547 B2
(45) Date of Patent: Sep. 20, 2011

(54) VERTICAL EXTENDED CAVITY SURFACE EMISSION LASER AND METHOD FOR MANUFACTURING A LIGHT EMITTING COMPONENT OF THE SAME

(75) Inventors: Holger Moench, Vaals (NL); Adriaan Valster, Waalre (NL); Martin Grabherr, Ulm (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/530,563

(22) PCT Filed: Mar. 10, 2008

(86) PCT No.: PCT/IB2008/050859
§ 371 (c)(1),
(2), (4) Date: Apr. 9, 2010

(87) PCT Pub. No.: WO2008/114160
PCT Pub. Date: Sep. 25, 2008

(65) Prior Publication Data
US 2010/0195690 A1      Aug. 5, 2010

(30) Foreign Application Priority Data
Mar. 16, 2007  (EP) .................................. 07104291

(51) Int. Cl.
*H01S 5/00*   (2006.01)
(52) U.S. Cl. ........................ 372/50.11; 438/27
(58) Field of Classification Search ............... 372/50.11, 372/50.121; 257/E33.56, E33.068; 438/27, 438/47
See application file for complete search history.

(56) References Cited

U.S. PATENT DOCUMENTS

| 5,837,561 | A  | 11/1998 | Kish et al. |
| 6,658,041 | B2 | 12/2003 | Uebbing |
| 6,687,282 | B2 | 2/2004  | Kim et al. |

(Continued)

FOREIGN PATENT DOCUMENTS

EP         0748007 A2   12/1996

(Continued)

OTHER PUBLICATIONS

Keeler et al: "Micromirrors for Wafer-Scale Fabrication of Electrically-Pumped Vescels"; Conference on Lasers and Electro-Optics, 2004, San Francisco, CA, IEEE, vol. 1, May 17, 2004, pp. 449-450.

(Continued)

*Primary Examiner* — Jessica T Stultz
*Assistant Examiner* — Tuan N Nguyen

(57) ABSTRACT

The present invention relates to a method of manufacturing the light emitting component of a VECSEL and the corresponding VECSEL. In the method a layer stack (2) is epitaxially grown on a semiconductor substrate (1). The layer stack comprises an active region (4), an upper distributed Bragg reflector (5) and a n- or p-doped current injection layer (13) arranged between the active region (4) and the semiconductor substrate (1). A mechanical support (6) or submount is bonded to an upper side of the layer stack (2) and the semiconductor substrate (1) is subsequently removed. A metallization layer (7) is optionally deposited on the lower side of the layer stack (2) and an optically transparent substrate (8) is bonded to this lower side. The proposed method allows the manufacturing of such a component in a standard manner and results in a VECSEL with a homogenous current injection and high efficiency of heat dissipation.

17 Claims, 5 Drawing Sheets

U.S. PATENT DOCUMENTS

| | | | |
|---|---|---|---|
| 6,760,359 B2 * | 7/2004 | Evans | 372/102 |
| 6,803,603 B1 * | 10/2004 | Nitta et al. | 257/79 |
| 6,979,582 B2 | 12/2005 | Horng et al. | |
| 7,122,446 B2 * | 10/2006 | Nitta et al. | 438/458 |
| 2004/0182914 A1 | 9/2004 | Venugopalan | |
| 2006/0023757 A1 | 2/2006 | Mooradian et al. | |
| 2006/0078027 A1 | 4/2006 | Kim | |

FOREIGN PATENT DOCUMENTS

| | | |
|---|---|---|
| WO | 2004064211 A1 | 7/2004 |
| WO | 2004086578 A2 | 10/2004 |
| WO | 2005117070 A2 | 12/2005 |

OTHER PUBLICATIONS

Keeler et al: "Electrically-Pumped 850-nm Micromirror Vecsels"; Vertical-Cavity Surface-Emitting Lasers IX, Chun Lei, Kent D. Choquette (Eds.), Proceedings of SPIE, vol. 5737, pp. 69-74.

Grabherr et al: "Comparison of Approaches to 850 nm-2-D VCSEL Arrays"; U-L-M Photonics, GMBH, 9 Page Document.

* cited by examiner

VERTICAL EXTENDED CAVITY SURFACE EMISSION LASER AND METHOD FOR MANUFACTURING A LIGHT EMITTING COMPONENT OF THE SAME

FIELD OF THE INVENTION

The present invention relates to a vertical extended cavity surface emission laser (VECSEL) comprising an extended mirror forming a first end mirror of the extended cavity, a layer stack having at least an active region for light emission and a distributed Bragg reflector (DBR) forming the second end mirror of said extended cavity, and a substrate to which the layer stack is attached. The invention also refers to a method of manufacturing a light emitting component of such a vertical extended cavity surface emission laser.

Vertical extended cavity surface emitting lasers are a promising technology for projection applications. The IR emitting components of such a laser can be converted to blue, green and red light by second harmonic generation with nonlinear crystals inside the extended laser cavity.

BACKGROUND OF THE INVENTION

Vertical cavity surface emitting lasers (VCSEL) are typically formed of a layer stack comprising an active (gain) region, sandwiched between two distributed Bragg reflectors. The layer stack is composed of appropriate dielectric and/or semiconductor layer sequences. The laser cavity is formed of the two DBRs, one of which, for outcoupling purposes, has a lower reflectance at the lasing wavelength than the other one. In case of a vertical extended cavity surface emission laser, the resonating cavity is formed between the DBR having the higher reflectance and an extended mirror. The second DBR which would be arranged inside this extended cavity can be omitted or is designed to have even lower reflectance at the lasing wavelength compared to a VCSEL.

For stable operation of such a VECSEL an optical lens is required inside the extended cavity to form a stable resonator with two flat end mirrors. Furthermore, the heat generated during operation of such a laser must be efficiently dissipated from the active region.

WO 2004/086578 A2 discloses to attach an optically transparent substrate to the free side of the layer stack inside the extended cavity. This transparent substrate is used as a heat spreader and designed to have one or more further selected properties to influence the light which is output from the laser. Examples of such further properties are polarizing properties to achieve a desired polarization of the laser radiation, a nonlinear optical response to achieve frequency doubling of the laser radiation or the provision of a curved surface to focus or defocus the output light.

The thermal conductivity of transparent substrates however is not sufficient to use them as an effective heat sink. Furthermore, a homogeneous current injection into the active region is difficult to achieve when the transparent substrate is not electrically conductive.

SUMMARY OF THE INVENTION

It is an object of the present invention to provide a method of manufacturing the light emitting component of a vertical extended cavity surface emission laser as well as a vertical extended cavity surface emitting laser comprising such a component, which method can be performed with standard semiconductor manufacturing processes and achieves a light emitting component with a homogenous current injection and high efficiency of heat dissipation.

The object is achieved with the method and vertical extended cavity surface emission laser according to claims 1 and 13. Advantageous embodiments of the method and laser are subject matter of the dependent claims or are described in the subsequent portions of the description.

In the proposed method a layer stack is epitaxially grown on a semiconductor substrate. Said layer stack comprises semiconductor layers forming an active region, an upper layer sequence forming an upper distributed Bragg reflector and a n- or p-doped current injection layer between the semiconductor substrate and the active region. The upper distributed Bragg reflector is designed to have a high reflectance for the lasing wavelength. The layer materials and layer thicknesses as well as the procedure for epitaxially growing and structuring such a layer stack to form a vertical light emitting diode is generally known in the art. Optionally the layer stack is grown such that it comprises also a lower layer sequence forming a lower distributed Bragg reflector between the active region and the n- or p-doped current injection and spreading layer. This lower distributed Bragg reflector is designed to have a lower reflectance for the lasing wavelength than the upper distributed Bragg reflector.

At first the upper part of the substrate with the layer stack is structured and partly metallised to generate electrical confinement. In the next step the semiconductor substrate with the layer stack is bonded with the upper side of the layer stack to a support or submount substrate. The semiconductor substrate is then removed, for example by etching or ablation. Then an optically transparent substrate, for example a glass substrate, is bonded to the lower side of the layer stack resulting in an epitaxially grown stack of mirror layers (forming the DBR(s)), gain layers (forming the active region) and an n- or p-doped current injection layer on the side of the optically transparent substrate.

This light emitting component can then be mounted to form a vertical extended cavity surface emitting laser together with an extended mirror, wherein the upper distributed Bragg reflector forms one of the end mirrors and the extended mirror forms the other end mirror of the extended cavity. The transparent substrate is placed inside of this extended cavity and can be designed to provide further functions influencing the optical properties of the laser radiation.

In a preferred embodiment, following the step of removing the semiconductor substrate, a metallization layer is deposited on the now uncovered lower side of the layer stack. This metallization layer can be additionally structured, if necessary for operation of the light emitting component.

In a further preferred embodiment, all method steps are performed on a wafer level. This means that the semiconductor substrate is a wafer substrate on which said layer stack is epitaxially grown and structured to form a multiplicity of vertical light emitting diodes side by side. After wafer-bonding of said optically transparent substrate, the resulting substrate and layer stack is cut into single components, each component comprising one or several of the light emitting diodes.

The support substrate can be removed prior to the step of cutting into individual components. An appropriate heat sink can then be bonded to this side of the component, preferably prior to the cutting step. As an alternative, the submount structure bonded to the layer stack on the upper side can already form such a heat sink, for example made of a metal-ceramic composite with integrated conductor structures for electrically contacting the layer stack from one side. The submount structure then remains on the components.

The proposed vertical extended cavity surface emitting laser according to the present invention therefore comprises at least an extended mirror forming a first end mirror of an extended cavity, an optically transparent substrate, a layer stack and a heat sink. The layer stack has an active region (gain medium), an outer distributed Bragg reflector and a n- or p-doped current injection layer arranged on the side of the optically transparent substrate. The outer distributed Bragg reflector forms the second end mirror of the extended cavity. Optionally, the layer stack also comprises an inner distributed Bragg reflector sandwiched between the active region and the current injection layer, the inner distributed Bragg reflector having a lower reflectance for the lasing wavelength than the outer distributed Bragg reflector. The transparent substrate is arranged inside of the extended cavity and attached to the layer stack at the side of the current injection layer. The heat sink is attached to the layer stack at the side of the outer distributed Bragg reflector. The proposed vertical extended cavity surface emission laser furthermore preferably comprises a metallic layer sandwiched between the n- or p-doped current injection layer and said transparent substrate.

Due to the substitution of the semiconductor substrate by the optically transparent substrate, this now transparent side can be used for light emission of the light emitting component, i.e. can be placed inside of the extended cavity. This allows the attachment of an efficient heat sink on the outer side of the light emitting component very close to the heat producing active region which results in a highly efficient heat dissipation.

The metallization layer, which is included in a preferred embodiment, improves the homogenization of the current distribution and allows to use a very thin n- or p-doped current injection layer without the need of a conductive substrate. This metal layer can be electrically contacted either from the side of the transparent substrate through appropriate via holes which can be etched in the substrate or the current injection layer is contacted from the side of the upper DBR through appropriate holes or groves as is known in the art (see e.g. p-contact 14 in FIGS. 2 and 3 showing a metallization contacting the current injection layer 13). The method can be applied with known techniques of producing vertical cavity surface emitting lasers allowing a cost effective mass production.

The layer thickness and doping concentration of the current injection layer are preferably in the following ranges, dependent on the way of contacting and doping (p- or n-type):

Case 1: contacting via the metal layer: thickness of doped layer 100-1000 nm, p-type 10E18-10E20 $cm^{-3}$, n-type 10E17-10E18 $cm^{-3}$.

Case 2: contacting via the doped layer: thickness of doped layer 100-1000 nm, p-type 10E19-10E20 $cm^{-3}$, n-type 10E17-10E18 $cm^{-3}$.

Case 3: contacting via the doped layer, no metal layer present: thickness of doped layer 500-5000 nm, p-type 10E19-10E20 $cm^{-3}$, n-type 10E17-10E18 $1/cm^{-3}$.

In cases 1 and 2 the preferred thickness of the metal layer is between 1 and 10 nm when unpatterned and between 10 and 50 nm when patterned.

The thickness of the doped layer in any case is selected to be phase matched to standing wave pattern of the laser radiation inside of the extended cavity.

As can be seen from these preferred ranges, the provision of the metal layer allows the thickness of the current injection layer to be reduced, which results in less absorption of the laser radiation in this layer. Alternatively or in addition the doping concentration of this layer can be reduced with the same result.

In a preferred embodiment, the transparent substrate is already prefabricated to provide further optical functions inside of the vertical extended cavity surface emitting laser. The transparent substrate, in particular a glass substrate, can for example be structured to achieve the effect of a collimating lens. Generally, the transparent substrate can also be formed of a layer stack of optically transparent material layers. The transparent substrate can also be made of a birefringent material in order to provide the optical function of a polarizer or can be made of a nonlinear optical material for frequency doubling purposes. In the latter case the light emitted by the component is frequency doubled in this substrate to achieve a laser emitting, for example, in the green wavelength region. Nevertheless, such optical components like a lens or a frequency doubling crystal can also be arranged inside of the extended laser cavity between the light emitting component and the extended mirror for the same purposes. Furthermore, the transparent substrate may have dielectric coatings on one or both sides in order to lower the surface reflectivity or to provide a wavelength filtering function. In another embodiment the transparent substrate can be structured to form a volume Bragg grating (VBG) for appropriate wavelength stabilization of the laser emission.

The metallic layer must be designed or arranged such inside of the extended laser cavity that this metallization does not prohibit the laser operation. To this end, this metallization may be structured to provide openings or holes at the positions at which the laser radiation propagates inside the extended cavity. With this structuring of the metallization layer it is also possible to additionally influence the mode structure of the laser radiation by appropriate optical confinement.

In a further preferred embodiment the metallization layer is arranged in a node of a standing wave of the laser radiation formed inside of the laser cavity. In this position the metallization layer does not disturb the laser operation even if the metallization layer is not structured. Preferably the metallization layer in this case has a very low thickness of less than 100 more preferably less than 10 nm.

In the proposed method all wafer processing for generating the layer stack can be done in the standard way of producing VCSELs. After finishing the processes the substrate transfer is done.

Preferably the semiconductor substrate on which the layer stack is epitaxially grown is a p- or n-doped GaAs substrate or a semiinsulating GaAs substrate. In one such embodiment, the lower DBR is formed of a p-doped layer sequence of between 4 and 13 pairs of p-doped layers with alternating refractive index, whereas the upper DBR is formed of more than 20 pairs of n-doped layers with alternating refractive index. In this case a p-doped current injection layer is formed between the metallization and the lower DBR.

These and other aspects of the invention will be apparent from and elucidated with reference to the embodiments described herein after.

BRIEF DESCRIPTION OF THE DRAWINGS

The proposed method and vertical extended cavity surface emission laser are described in the following by way of examples in connection with the accompanying figures without limiting the scope of protection as defined by the claims. The figures show:

DETAILED DESCRIPTION OF EMBODIMENTS

Figure 1A:
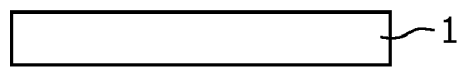
FIG. 1 a schematic view showing method steps of the proposed method.
Figure 1B:
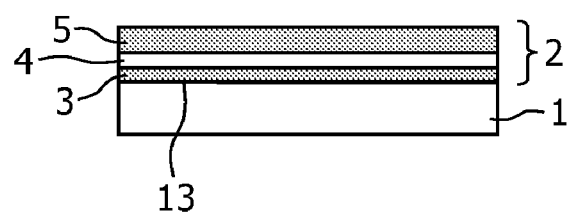

FIG. 1 shows a sequence of method steps which are performed according to an exemplary embodiment of the proposed method. In a first step, according to FIG. 1a, a GaAs semiconductor substrate 1 is provided. A layer stack 2 forming a p-doped current injection layer 13, a lower distributed Bragg reflector 3, an active region 4 and an upper distributed Bragg reflector 5 is epitaxially grown on the semiconductor substrate 1 (FIG. 1b). The two DBRs 3, 5 are stacks of many pairs of semiconductor layers, in the most simple case each λ/4 thick at the design wavelength λ, i.e. the wavelength of the laser in the semiconductor material. Each pair is composed of a high and low refractive index layer, for example of AlGaAs. The upper DBR 5 is designed to have a reflectance of 98-99.9% (or even >99.9%) at the laser wavelength and is therefore formed of more than 20 p-doped layer pairs. In the case of the lower DBR 3, this DBR is formed of only between 4 to 13 pairs of n-doped layers resulting in a lower reflectance of between 50% and 95% at the laser wavelength. This lower reflectance is necessary since the side of the lower DBR 3 is the light output side of the light generated in the active region 4. The active region 4 may be made of a quantum well structure, for example of three InGaAs quantum wells embedded in GaAs.

In the next step the epitaxial layers are structured in the usual manner. Especially metallic contacts for p or n sides are provided.

Figure 1C:
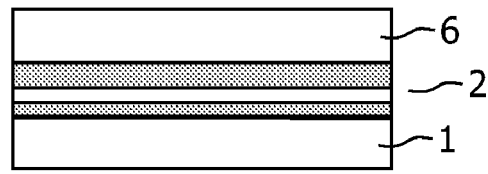
Figure 1D:
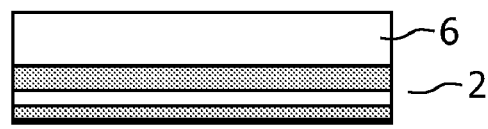
Figure 1E:
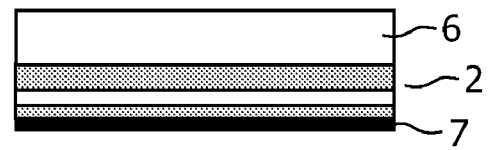
Figure 1F:
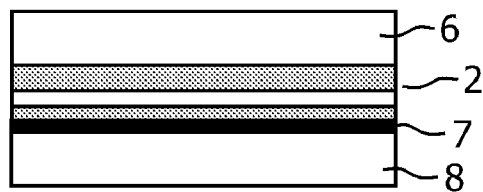
Figure 1G:
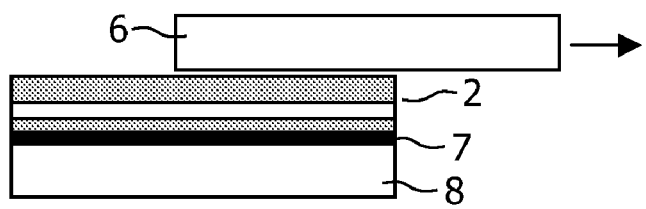
Figure 1H:
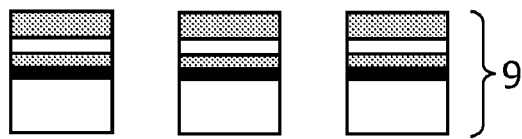
Figure 1I:
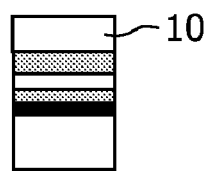

In the next step an auxiliary substrate 6 serving as a supporting substrate is bonded to the upper surface of the layer stack 2 (FIG. 1c). The semiconductor substrate 1 is then removed by etching (FIG. 1d). Following this etching step a metallization layer 7 is deposited on the lower side of the layer stack 2 (FIG. 1e). Then a glass substrate 8 is bonded to the lower side of the layer stack 2 according to FIG. 1f. The metallization layer 7 is now sandwiched between the layer stack 2 and the glass substrate 8. The auxiliary substrate 6 can then be removed. The result is a layer stack 2 on the glass substrate 8 with a metallization layer 7 sandwiched in between. This substrate and layer stack is then cut into individual components or chips 9 in the usual manner, for example by sawing. To the upper side of these components an appropriate heat sink 10 is attached. These components emit light through the glass substrate and are used as the light emitting component of a vertical extended cavity surface emitting laser as shown for example in FIG. 2 or 3.

Figure 2:
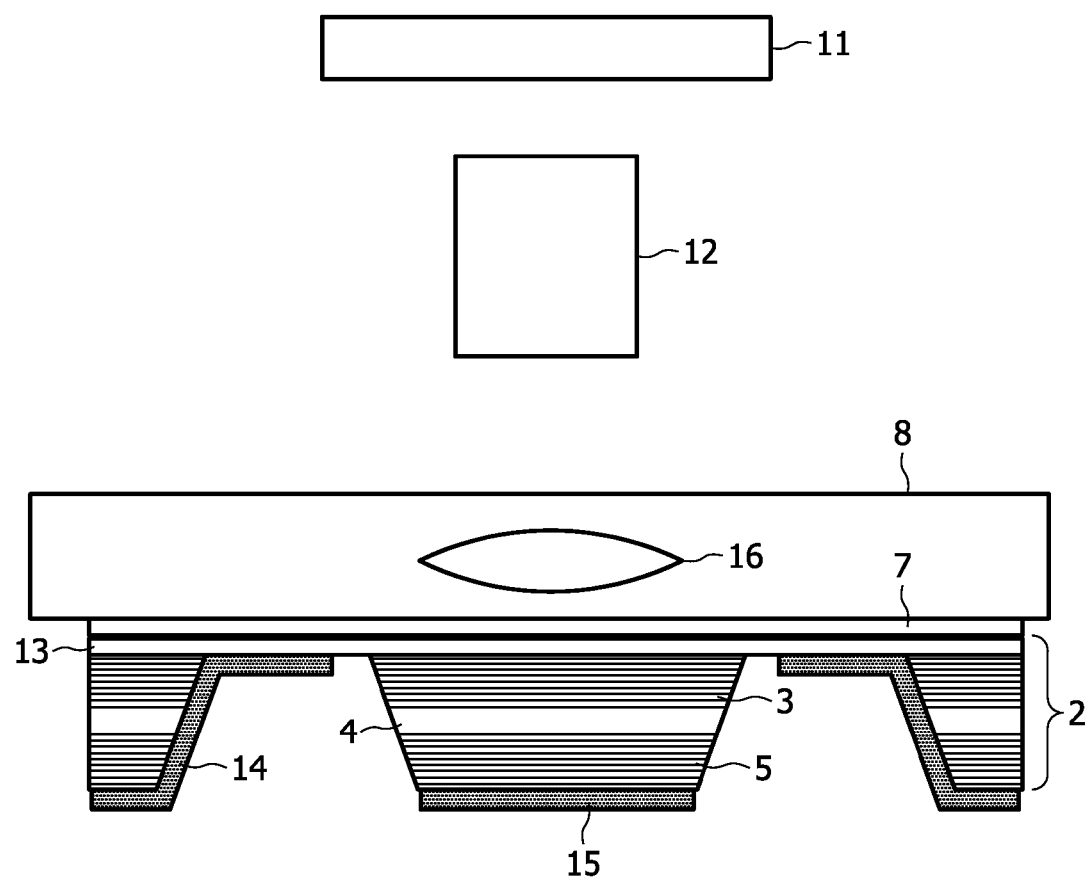
FIG. 2 a partial cut view of a VECSEL according to a first embodiment of the present invention.
Figure 3:
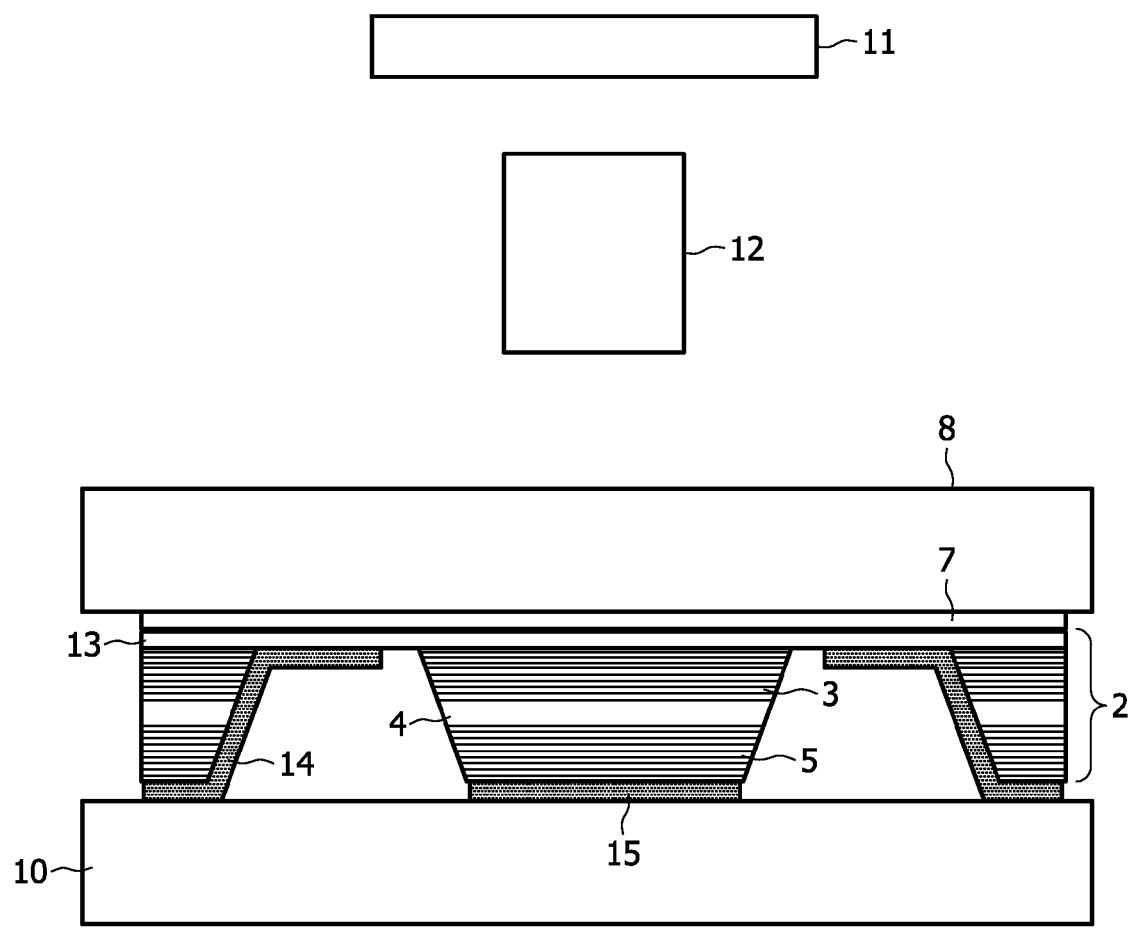
FIG. 3 a partial cut view of a VECSEL according to a second embodiment of the present invention.

FIG. 2 shows an example for such a VECSEL in a partial cut view. In this figure the layer stack 2 attached to the glass substrate 8 is shown on one side of the extended cavity and an extended mirror 11 on the opposing side. The extended mirror 11 may be a dichroitic mirror and represents the first end mirror of the extended cavity or it may be a VBG with a spectrally narrow (<0.5 nm) reflectance. The second end mirror is formed of the upper DBR 5 (in this figure on the lower side) of the layer stack 2. The same reference signs in FIGS. 2 and 3 represent the same components as already described in connection with FIG. 1. Between the glass substrate 8 and the extended mirror 11 a further optical component 12, for example a frequency doubling nonlinear optical crystal, may be arranged. Nevertheless, also other optical components may be arranged between the extended mirror 11 and the glass substrate 8. The glass substrate 8 is covered on the side of the layer stack by metallization 7 and highly conductive p-doped layer 13, the latter being already formed when epitaxially growing the layer stack 2.

Preferably before removing the semiconductor substrate the contacting of the layers 13 and 7 is done via lithography and subsequent etching. To this end grooves are etched in the layer stack 2 after epitaxially growing the stack. After etching the grooves an isolation layer and subsequently an appropriate metallization are deposited and structured to provide a p-contact 14 for the p-doped injection layer 13 and a n-contact 15 for the opposing side of the layer stack.

A heat sink can then be soldered or bonded to the free side of the layer stack 2. All electrical connections and thermal contacts can be made through this heat sink.

In this embodiment a lens 16 is formed inside of the glass substrate 8. Such a lens can be formed in the substrate by appropriate techniques known in the art prior to the bonding of the substrate to the layer stack, for example by appropriately modifying the refractive index of the glass inside of the glass substrate 8. Also an array of lenses can be scribed into this glass substrate. A further possibility is to heat press or mold a lens onto the surface of the glass substrate.

FIG. 3 shows a further embodiment which is different from the embodiment of FIG. 2 only in the missing lens inside the glass substrate 8 and the attached heat sink 10. The further construction of this device is the same as already described with reference to FIG. 2.

Figure 4:
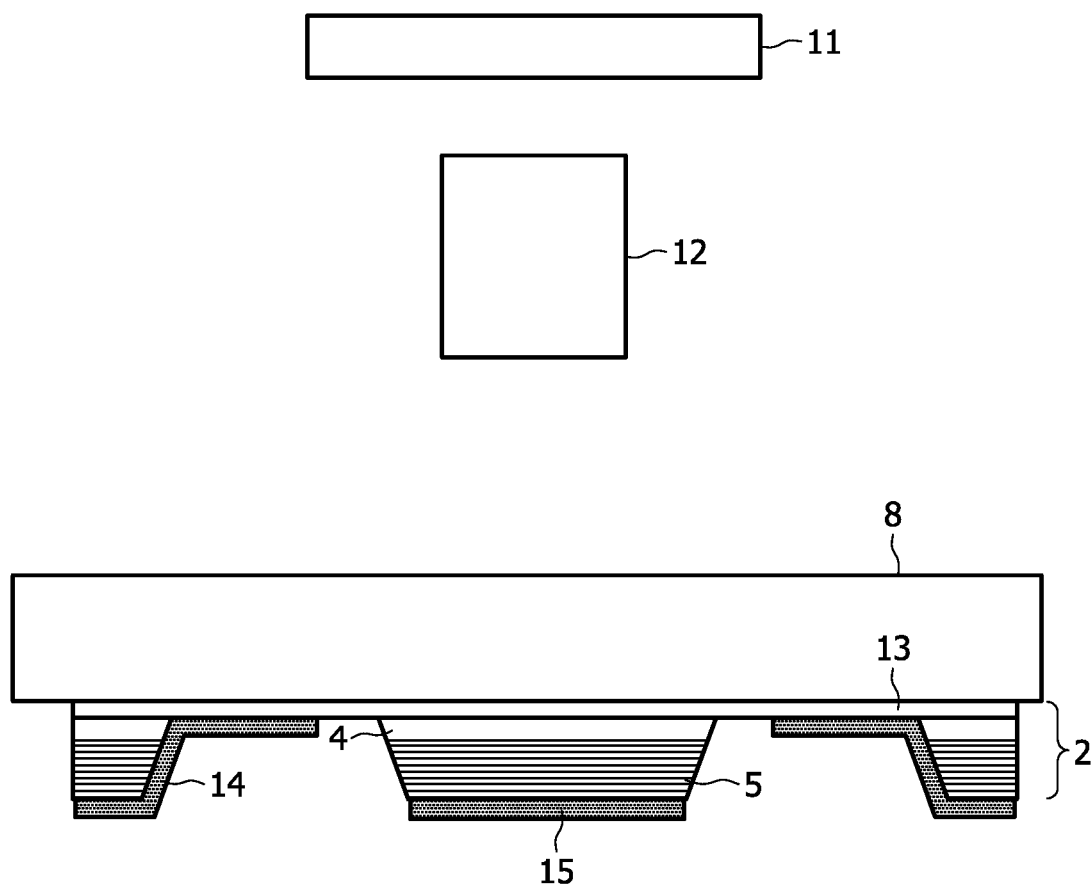
FIG. 4 a partial cut view of a VECSEL according to a third embodiment of the present invention.

FIG. 4 shows a further embodiment which is different from the embodiment of FIG. 2 in the missing lens inside the glass substrate 8, the missing lower DBR and the missing metal layer. The further construction of this device is the same as already described with reference to FIG. 2.

While the invention has been illustrated and described in detail in the drawings and forgoing description, such illustration and description are to be considered illustrative or exemplary and not restrictive, the invention is not limited to the disclosed embodiments. The different embodiments described above and in the claims can also be combined. Other variations to the disclosed embodiments can be understood and effected by those skilled in the art in practicing the claimed invention, from a study of the drawings, the disclosure and the appended claims. For example the VECSEL may also be formed of an array of light emitting components in a side by side arrangement to provide a VECSEL array. In this case the array shares a single transparent substrate. It is also possible to combine the glass substrate with other transparent plates with different optical functions, e.g. a stack can be formed out of a glass plate, a plate made of a nonlinear optical material and the extended mirror (VBG or Dichroic). This stack can be prefabricated prior to the bonding to the semiconductor structure.

All optical surfaces may be coated in the usual manner by antireflection layers or by reflective dichroic coatings for either the fundamental IR radiation or the frequency doubled (e.g. green) radiation.

In the claims, the word "comprising" does not exclude other elements or steps, and the indefinite article "a" or "an" does not exclude a plurality. The mere fact that measures are recited in mutually different dependent claims does not indicate that a combination of these measures cannot be used to advantage. Any reference signs in the claims should not be construed as limiting the scope of these claims.

LIST OF REFERENCE SIGNS 1 semiconductor substrate
2 layer stack
3 lower DBR
4 active region
5 upper DBR
6 support substrate
7 metallization layer
8 glass substrate
9 light emitting component
10 heat sink
11 extended mirror
12 frequency doubling crystal
13 p-doped current injection layer
14 p-contact
15 n-contact
16 integrated lens

The invention claimed is:

1. Vertical extended cavity surface emission laser comprising:
an extended mirror forming a first end mirror of an extended cavity,
a first distributed Bragg reflector for a lasing wavelength forming a second end mirror of the extended cavity,
an active region for light emission being arranged on an inner side of the distributed Bragg reflector, said active region and said distributed Bragg reflector forming at least part of a layer stack,
an optically transparent substrate inside of said extended cavity being attached to the layer stack and
a heat sink being attached to the layer stack at an outer side of the distributed Bragg reflector,
a current injection layer disposed between the active region and the optically transparent substrate, and
a metallization layer disposed between said current injection layer and said transparent substrate.

2. Vertical extended cavity surface emission laser according to claim 1, wherein an second distributed Bragg reflector is disposed between the active region and the current injection layer with a reflectivity which is lower for the lasing wavelength than the reflectivity of said first distributed Bragg reflector forming the second end mirror, said second distributed Bragg reflector being formed of between 4 and 13 pairs of layers.

3. Vertical extended cavity surface emission laser according to claim 2, wherein said distributed Bragg reflector forming the second end mirror is formed of more than 20 pairs of layers.

4. Vertical extended cavity surface emission laser according to claim 1, wherein the transparent substrate has a dichroic coating with a reflectivity which is lower for the lasing wavelength than the reflectivity of said first distributed Bragg reflector forming the second end mirror.

5. Vertical extended cavity surface emission laser according to claim 1, wherein said optically transparent substrate is a glass substrate.

6. Vertical extended cavity surface emission laser according to claim 1, wherein further optical components are arranged inside said extended cavity between said extended mirror and said transparent substrate.

7. Vertical extended cavity surface emission laser according to claim 1, wherein said metallic layer is structured to influence current distribution in the active region and/or optical behavior of the laser.

8. Vertical extended cavity surface emission laser according to claim 1, wherein said metallic layer is arranged in a node of a standing wave of laser radiation forming in the extended cavity.

9. Vertical extended cavity surface emission laser according to claim 1, wherein said heat sink comprises a conductor structure for electrically contacting said layer stack.

10. Vertical extended cavity surface emission laser according to claim 1, wherein the transparent substrate is designed to perform an optical function, in particular designed to form a polarizer, a lens or a frequency doubling crystal.

11. Vertical extended cavity surface emission laser according to claim 1, wherein the transparent substrate comprises one or more material layers, at least some of which having different optical functions.

12. A method of manufacturing the light emitting component of a vertical extended cavity surface emission laser, the method comprising at least the following steps:
epitaxially growing a layer stack on a semiconductor substrate (1), said layer stack comprising at least layers forming an active region for light emission, an upper layer sequence forming an upper distributed Bragg reflector and an n- or p-doped current injection layer disposed between the semiconductor substrate (1) and the active region,
attaching a mechanical support to an upper side of the layer stack,
removing the semiconductor substrate,
depositing a metallization layer on the lower side of the layer stack, and
bonding an optically transparent substrate to the lower side of the layer stack.

13. The method of claim 12, wherein the epitaxially grown layer stack further comprises a lower layer sequence forming a lower distributed Bragg reflector between the active region and the n- or p-doped current injection layer.

14. The method of claim 12, wherein the mechanical support is bonded to the upper side of the layer stack and removed after the step of bonding the optically transparent substrate to the lower side of the layer stack.

15. The method of claim 12, wherein the submount is bonded or soldered to the upper side of the layer stack.

16. The method of claim 12, wherein the metallization layer defines one or more holes for light transmittance.

17. The method of claim 12, wherein said semiconductor substrate (1) is a wafer substrate, said layer stack is epitaxially grown to form a multiplicity of vertical light emitting diodes side by side on said wafer substrate and, after bonding of said optically transparent substrate, the resulting substrate and layer stack is cut into single components, each component comprising one or several of the light emitting diodes.

* * * * *